United States Patent
Francis

(10) Patent No.: US 9,082,608 B2
(45) Date of Patent: Jul. 14, 2015

(54) PNEUMATIC CLAMPING MECHANISM FOR CELLS WITH ADJUSTABLE HEIGHT

(71) Applicant: Intermolecular, Inc., San Jose, CA (US)

(72) Inventor: Aaron T. Francis, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 329 days.

(21) Appl. No.: 13/692,206

(22) Filed: Dec. 3, 2012

(65) Prior Publication Data

US 2014/0150245 A1 Jun. 5, 2014

(51) Int. Cl.
*B01L 3/00* (2006.01)
*H01L 21/00* (2006.01)
*H01L 21/67* (2006.01)

(52) U.S. Cl.
CPC ............ *H01L 21/00* (2013.01); *H01L 21/6719* (2013.01); *Y10T 29/49998* (2015.01)

(58) Field of Classification Search
CPC ................ B01L 2300/0609; B01L 3/5085
USPC ........................................ 422/503, 551, 560
See application file for complete search history.

(56) References Cited

U.S. PATENT DOCUMENTS

| | | |
|---|---|---|
| 4,325,518 A | 4/1982 | Karr et al. |
| 5,112,469 A | 5/1992 | Kempf et al. |
| 5,222,719 A | 6/1993 | Effner |
| 5,714,127 A * | 2/1998 | DeWitt et al. ................. 422/131 |
| 6,161,311 A | 12/2000 | Doley et al. |
| 6,343,784 B1 | 2/2002 | Jourde et al. |
| 6,439,559 B1 | 8/2002 | Kinnard et al. |
| 6,450,755 B1 | 9/2002 | Cameron et al. |
| 6,935,932 B2 | 8/2005 | Kimura et al. |
| 7,108,589 B2 | 9/2006 | Kimura et al. |
| 7,465,558 B2 | 12/2008 | Vasylyev et al. |
| 2002/0008345 A1 | 1/2002 | Van Der Toorn |
| 2010/0255195 A1 | 10/2010 | Lambert et al. |

OTHER PUBLICATIONS

USPTO; Office Action for U.S. Appl. No. 12/599,065 mailed on Jul. 3, 2012, 11 pages.
USPTO; Office Action for U.S. Appl. No. 13/270,341 mailed on May 3, 2013, 16 pages.

* cited by examiner

*Primary Examiner* — Natalia Levkovich

(57) ABSTRACT

In some embodiments of the present disclosure, an apparatus for combinatorial wet processing includes: a chuck, a substrate located on the chuck, a cell located over the substrate; and a height adjustment mechanism for the cell above the substrate wherein applying compressed air on an O-ring in a gland prevents vertical movement of the cell relative to the position of the substrate.

7 Claims, 6 Drawing Sheets

PNEUMATIC CLAMPING MECHANISM FOR CELLS WITH ADJUSTABLE HEIGHT

FIELD OF THE DISCLOSURE

The present disclosure relates to an apparatus for and a method of clamping cells with adjustable height over site-isolated regions on a substrate during combinatorial processing. The disclosure maintains a specified vertical gap between the cells and the surface of the substrate.

BACKGROUND OF THE DISCLOSURE

Combinatorial processing permits fast evaluation of operations in the manufacture of semiconductor, solar, and green energy devices. Systems supporting combinatorial processing are sufficiently flexible to accommodate the demands of comparing many different processes both in parallel and in series.

Some exemplary operations include cleaning operations, additive operations, patterning operations, subtractive operations, and doping operations. These operations may be used in the manufacture of devices, such as integrated circuits (IC), semiconductors, flat panel displays, optoelectronics, data storage, packaged devices, and so on.

As dimensions of features on the devices continue to shrink, improvements are sought for materials, operations, processes, and sequences of these operations. Research and development (R&D) is typically conducted by running split lots on entire substrates. Unfortunately, this approach is costly and time-consuming.

Efficient experimentation in a timely and cost effective manner has become a highly desirable goal. In particular, combinatorial processing may be usefully applied to operations such that multiple experiments may be performed over a short period of time. Equipment for performing combinatorial processing and characterization should support the efficient data collection offered by the combinatorial processing operations.

A substrate is divided into site-isolated regions so as to perform multiple experiments separately on the substrate. A seal is formed around the bottom of each cell over the edge of the corresponding site-isolated region by using a fluid barrier such as a gas. In particular, the height of the bottom of the cell above an upper surface of the substrate must be selected and maintained precisely to form an effective seal prior to performing combinatorial processing.

SUMMARY OF THE DISCLOSURE

The following summary is included in order to provide a basic understanding of some aspects and features of the disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

In some embodiments, pneumatic clamping mechanisms are used to maintain gap heights for cells with adjustable heights. The pneumatic clamping may be compatible with the equipment and the operations for combinatorial processing. Most importantly, the pneumatic clamping does not affect the placement and positioning of the cells.

BRIEF DESCRIPTION OF THE DRAWINGS

To facilitate understanding, identical reference numerals have been used, wherever possible, to designate identical elements that are common to the figures. The drawings are not to scale and the relative dimensions of various elements in the drawings are depicted schematically and not necessarily to scale.

The techniques of the present disclosure may readily be understood by considering the following detailed description in conjunction with the accompanying drawings, in which.

DETAILED DESCRIPTION

Figure 1:
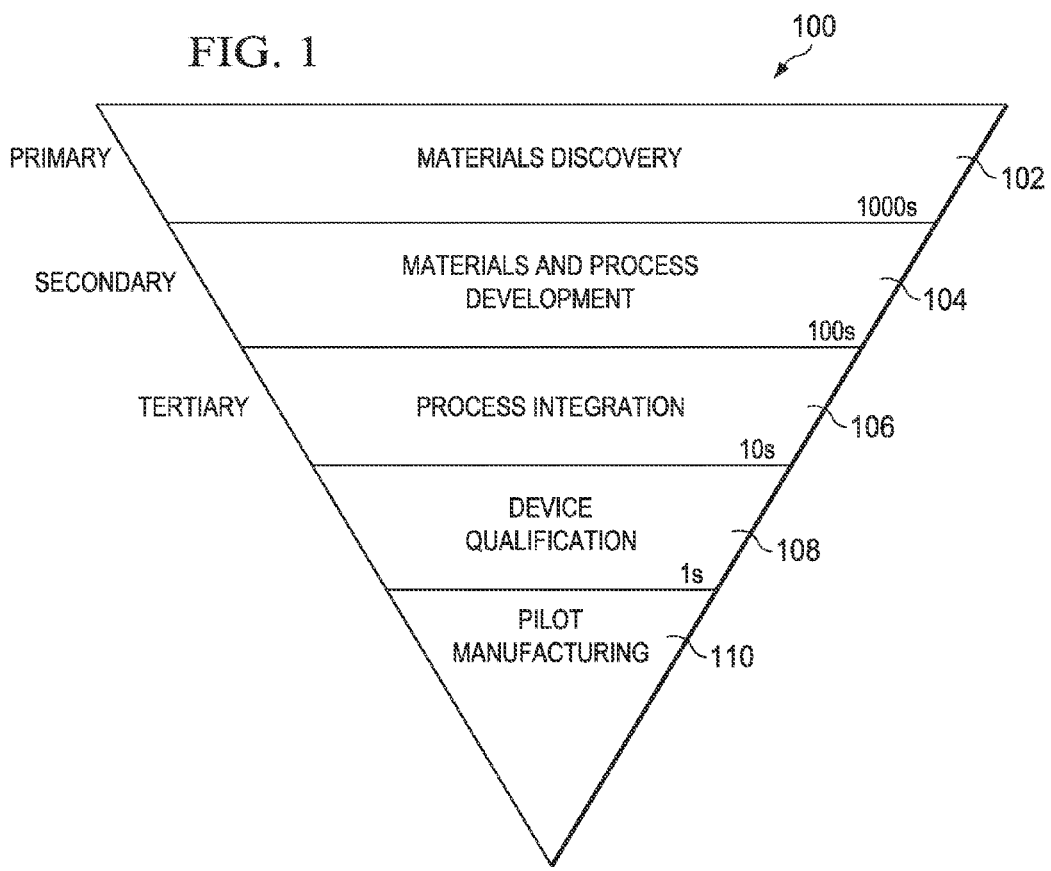
FIG. 1 is a schematic diagram for implementing combinatorial processing and evaluation using primary, secondary, and tertiary screening.

Methods and apparatuses for combinatorial processing are disclosed. Methods of the present disclosure include introducing a substrate into a processing chamber. In some embodiments, methods include applying at least one subsequent process to each site-isolated region. In addition, methods include evaluating results of the films post processing.

Before the present disclosure is described in detail, it is to be understood that unless otherwise indicated this disclosure is not limited to specific layer compositions or surface treatments. It is also to be understood that the terminology used herein is for the purpose of describing particular embodiments only and is not intended to limit the scope of the present disclosure.

It must be noted that as used herein and in the claims, the singular forms "a," and "the" include plural referents unless the context clearly dictates otherwise. Thus, for example, reference to "a layer" also includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region may include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, coated silicon, other semiconductor materials, glass, polymers, metal foils, etc. The term "substrate" or "wafer" may be used interchangeably herein. Semiconductor wafer shapes and sizes may vary and include commonly used round wafers of 2", 4", 200 mm, or 300 mm in diameter.

It is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence (s) of processes, and combinations thereof. This may greatly improve both the speed and reduce the costs associated with the discovery, implementation, optimization, and qualification of material(s), process(es), and process integration sequence(s) required for manufacturing.

Systems and methods for HPC™ processing are described in U.S. Pat. No. 7,544,574 filed on Feb. 10, 2006; U.S. Pat. No. 7,824,935 filed on Jul. 2, 2008; U.S. Pat. No. 7,871,928 filed on May 4, 2009; U.S. Pat. No. 7,902,063 filed on Feb. 10, 2006; and U.S. Pat. No. 7,947,531 filed on Aug. 28, 2009 which are all herein incorporated by reference for all purposes. Systems and methods for HPC™ processing are further described in U.S. patent application Ser. No. 11/352,077 filed on Feb. 10, 2006, claiming priority from Oct. 15, 2005; U.S. patent application Ser. No. 11/419,174 filed on May 18, 2006, claiming priority from Oct. 15, 2005; U.S. patent application Ser. No. 11/674,132 filed on Feb. 12, 2007, claiming priority from Oct. 15, 2005; and U.S. patent application Ser. No. 11/674,137 filed on Feb. 12, 2007, claiming priority from Oct. 15, 2005 which are all herein incorporated by reference for all purposes.

HPC™ processing techniques have been successfully adapted to wet chemical processing such as etching, texturing, polishing, cleaning, etc. HPC™ processing techniques have also been successfully adapted to deposition processes such as physical vapor deposition (PVD) (i.e. sputtering), atomic layer deposition (ALD), and chemical vapor deposition (CVD).

In addition, systems and methods for combinatorial processing are further described in U.S. patent application Ser. No. 13/341,993 filed on Dec. 31, 2011 and U.S. patent application Ser. No. 13/302,730 filed on Nov. 22, 2011 which are all herein incorporated by reference for all purposes.

HPC™ processing techniques have been adapted to the development and investigation of absorber layers and buffer layers for thin film photovoltaic (TFPV) solar cells as described in U.S. patent application Ser. No. 13/236,430 filed on Sep. 19, 2011, entitled "*COMBINATORIAL METHODS FOR DEVELOPING SUPERSTRATE THIN FILM SOLAR CELLS*" and is incorporated herein by reference for all purposes.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages may be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e. microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes may proceed to pilot manufacturing 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from HPC™ techniques described in U.S. patent application Ser. No. 11/674,137 filed on Feb. 12, 2007 which is hereby incorporated by reference for all purposes. Portions of the '137 application have been reproduced below to enhance the understanding of the present disclosure.

While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete site-isolated region. Furthermore, while different materials or unit processes may be used for corresponding layers or steps in the formation of a structure in different site-isolated regions on the substrate during the combinatorial processing, the application of each layer or use of a given unit process is substantially consistent or uniform throughout the different site-isolated regions in which it is intentionally applied. Thus, the processing is uniform within a site-isolated region (inter-region uniformity) and between site-isolated regions (intra-region uniformity), as desired. It should be noted that the process may be varied between site-isolated regions, for example, where a thickness of a layer is varied or a material may be varied between the site-isolated regions, etc., as desired by the design of the experiment.

The result is a series of site-isolated regions on the substrate that contain structures or unit process sequences that have been uniformly applied within that site-isolated region and, as applicable, across different site-isolated regions. This process uniformity allows comparison of the properties within and across the different site-isolated regions such that the variations in test results are due to the varied parameter (e.g., materials, unit processes, unit process parameters, hardware details, or process sequences) and not the lack of process uniformity. In the embodiments described herein, the positions of the discrete site-isolated regions on the substrate may be defined as needed, but are preferably systematized for ease of tooling and design of experimentation. In addition, the number, variants and location of structures within each site-isolated region are designed to enable valid statistical analysis of the test results within each site-isolated region and across site-isolated regions to be performed.

Figure 2:
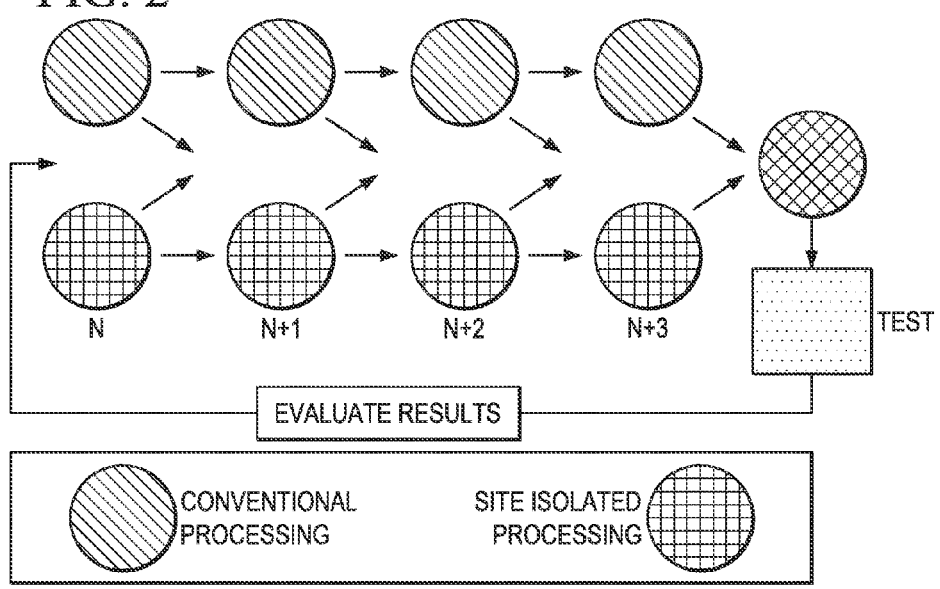
FIG. 2 is a schematic diagram for a general methodology for combinatorial process sequence integration that includes site-isolated processing and/or conventional processing.

FIG. 2 is a simplified schematic diagram illustrating a general methodology for combinatorial process sequence integration that includes site-isolated processing and/or conventional processing. In some embodiments, the substrate is initially processed using conventional process N. In some exemplary embodiments, the substrate is then processed using site-isolated process N+1. During site-isolated processing, an HPC™ module may be used, such as the HPC module described in U.S. patent application Ser. No. 11/352,077 filed on Feb. 10, 2006, which is incorporated herein by reference for all purposes. The substrate may then be processed using site-isolated process N+2, and thereafter processed using conventional process N+3. Testing is performed and the results are evaluated. The testing may include physical, chemical, acoustic, magnetic, electrical, optical, etc. tests. From this evaluation, a particular process from the various site-isolated processes (e.g. from steps N+1 and N+2) may be selected and fixed so that additional combinatorial process sequence integration may be performed using site-isolated processing for either process N or N+3. For example, a next process sequence may include processing the substrate using site-isolated process N, conventional processing for processes N+1, N+2, and N+3, with testing performed thereafter.

It should be appreciated that various other combinations of conventional and combinatorial processes may be included in the processing sequence with regard to FIG. 2. That is, the combinatorial process sequence integration may be applied to any desired segments and/or portions of an overall process flow. Characterization, including physical, chemical, acoustic, magnetic, electrical, optical, etc. testing, may be performed after each process operation, and/or series of process operations within the process flow as desired. The feedback provided by the testing is used to select certain materials, processes, process conditions, and process sequences and eliminate others. Furthermore, the above flows may be applied to entire monolithic substrates, or portions of monolithic substrates such as coupons.

Under combinatorial processing operations the processing conditions at different site-isolated regions may be controlled independently. Consequently, process material amounts, reactant species, processing temperatures, processing times, processing pressures, processing flow rates, processing powers, processing reactant compositions, the rates at which the reactions are quenched, deposition order of process materials, process sequence steps, hardware details, etc., may be varied from site-isolated region to site-isolated region on the substrate. Thus, for example, when exploring materials, a processing material delivered to first and second site-isolated regions may be the same or different. If the processing material delivered to the first site-isolated region is the same as the processing material delivered to the second isolated-region, this processing material may be offered to the first and second site-isolated regions on the substrate at different concentrations. In addition, the material may be deposited under different processing parameters. Parameters which may be varied include, but are not limited to, process material amounts, reactant species, processing temperatures, processing times, processing pressures, processing flow rates, processing powers, processing reactant compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used may be varied.

As mentioned above, within a site-isolated region, the process conditions are substantially uniform. That is, the embodiments described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the site-isolated regions. It should be appreciated that a site-isolated region may be adjacent to another site-isolated region in some embodiments or the site-isolated regions may be isolated and, therefore, non-overlapping. When the site-isolated regions are adjacent, there may be a slight overlap wherein the materials or precise process interactions are not known, however, a portion of the site-isolated regions, normally at least 50% or more of the area, is uniform and all testing occurs within that site-isolated region. Further, the potential overlap is only allowed with material of processes that will not adversely affect the result of the tests. Both types of site-isolated regions are referred to herein as site-isolated regions or discrete site-isolated regions.

Substrates may be a conventional round 200 mm, 300 mm, or any other larger or smaller substrate/wafer size. In some embodiments, substrates may be square, rectangular, or any other shape. One skilled in the art will appreciate that substrate may be a blanket substrate, a coupon (e.g., partial wafer), or even a patterned substrate having predefined site-isolated regions. In some other embodiments, a substrate may have site-isolated regions defined through the processing described herein.

Conventional systems using remote plasma sources were designed to treat the entire area of a substrate such as a 300 mm wafer. Combinatorial processing is difficult and expensive when the entire area of a substrate may only receive a single process variation. Embodiments of the present disclosure overcome this limitation by providing a remote plasma source, an associated substrate positioning system, and a site-isolation system that allows a selected site-isolated region on a substrate to be processed while the remaining site-isolated regions on the substrate are protected from exposure to the plasma and reactive radical species unless or until such exposure is intended.

Figure 3A:
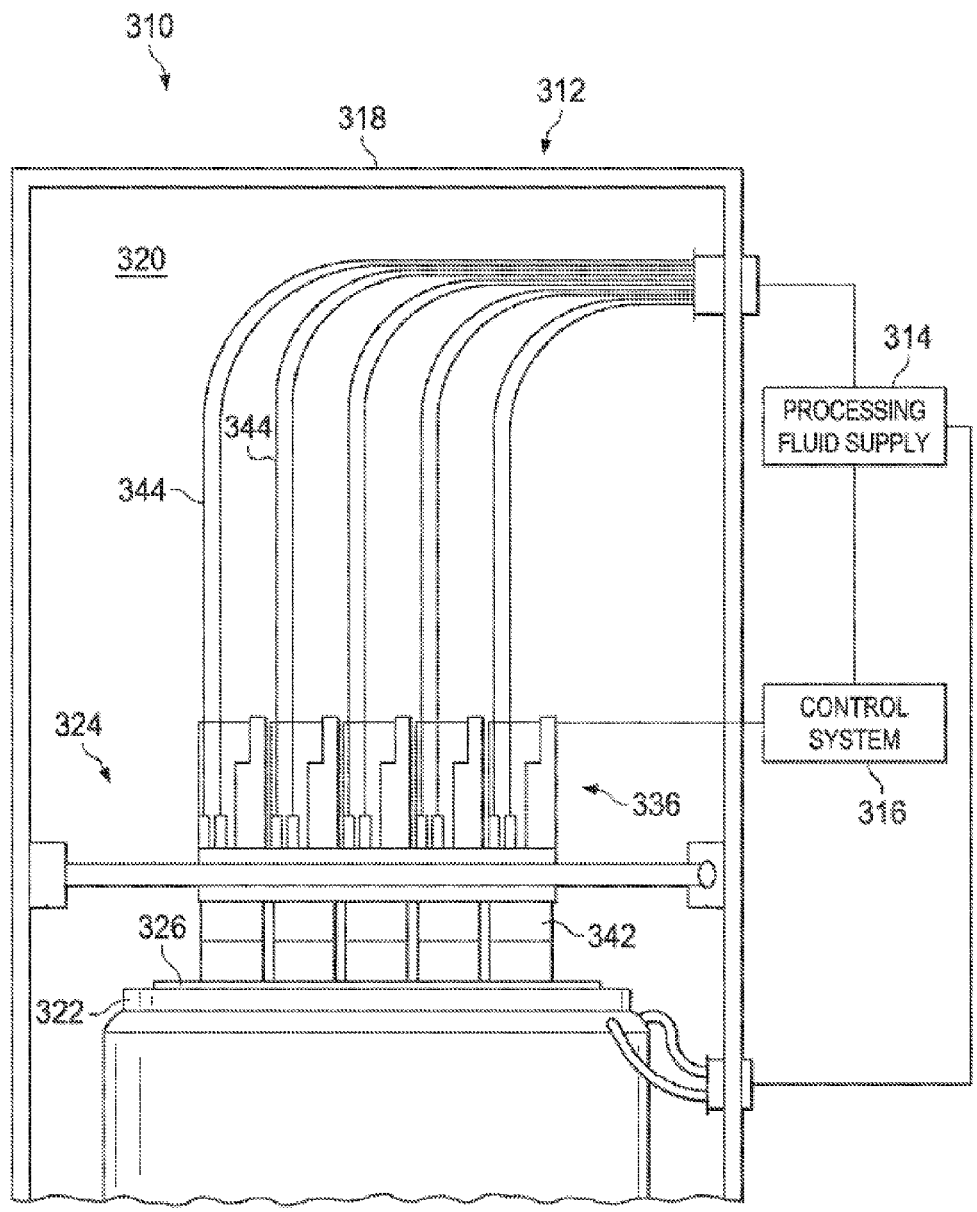
FIG. 3A is a simplified cross-sectional schematic view of a substrate processing tool, according to some embodiments of the present disclosure.
Figure 3B:
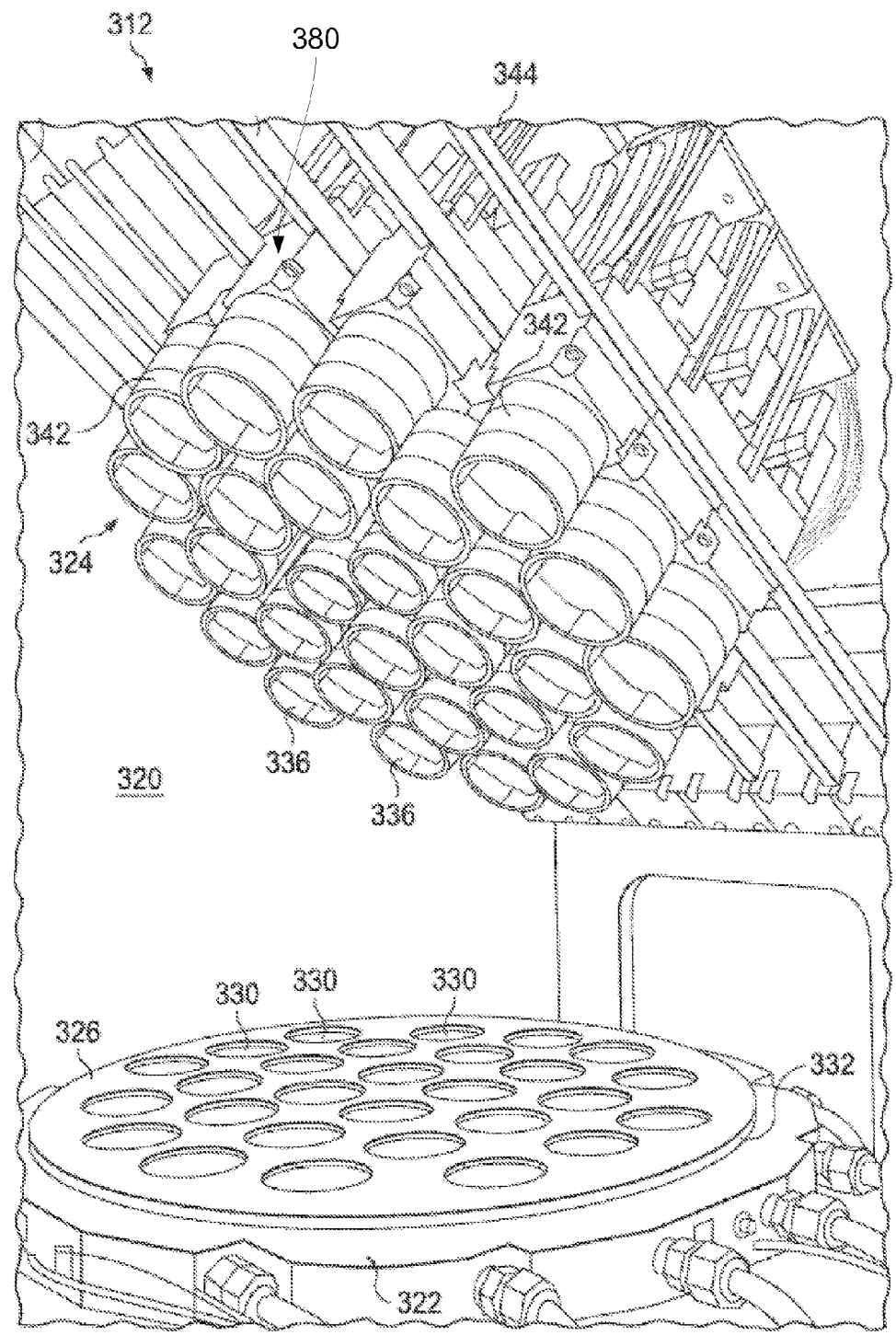
FIG. 3B is a perspective view of a processing chamber within the substrate processing tool of FIG. 3A.

FIGS. 3A and 3B illustrate a substrate processing system 310. In some embodiments, the substrate processing system 310 may include a wet processing tool 312, a processing fluid supply 314, and a control system 316. The substrate processing system 310 shown in FIGS. 3A and 3B may perform processes on site-isolated regions 330 (on a substrate 326) which are separated by interstitial regions.

The wet processing tool 312 includes a housing 318, a processing chamber 320, a substrate support 322, and a wet processing assembly 324. The substrate support 322 is positioned within the processing chamber 320 and is configured to hold the substrate 326.

The substrate support 322 may be configured to secure the substrate 326 using a vacuum chuck, an electrostatic chuck, or another mechanism. Further, the substrate support 322 may be coupled to the housing 318 via an actuator, such as a pneumatic cylinder which is configured to move the substrate support 322 in a vertical direction to position substrate 326.

Referring specifically to FIG. 3B, the substrate 326 includes a plurality of site-isolated regions 330 on an upper surface limited by an outer edge 332. As is evident in FIG. 3B, the site-isolated regions 330 have widths (or diameters) that are considerably smaller than a width (or diameter) of the substrate 326. As described below, each site-isolated region 330 may be processed by a corresponding one of multiple isolation units within the wet processing assembly 324. The portion(s) of the substrate 326 located outside the site-isolated regions 330 may be referred to as interstitial regions.

The substrate 326 may be a wafer having a diameter, such as 300 mm. In some embodiments, the substrate 326 may have other shapes, such as square or rectangular. It should be understood that the substrate 326 may be a blanket substrate (i.e., having a substantial uniform surface), a coupon (e.g., partial wafer), or even a patterned substrate having predefined regions, such as site-isolated regions 330. The site-isolated regions 330 may have a certain shape, such as circular, rectangular, elliptical, or wedge-shaped. A site-isolated region 330 may be, for example, a test structure, single die, multiple die, portion of a die, other defined portion of the substrate, or an undefined area of the substrate that may be subsequently defined through processing.

As shown in FIG. 3B, the isolation units 336 may be arranged in rows or columns, with each of the isolation units 336 corresponding to one of the site-isolated regions 330 on the substrate 326. However, it should be understood that the number and arrangement of the isolation units 336 may differ, as is appropriate given the size and shape of the substrate 326 and the arrangement of the site-isolated regions 330. In some embodiments, each isolation unit 336 includes a body, such as a container or reactor 342.

The substrate support 322 is then raised such that the bodies 342 of the isolation units 336 are located above the substrate 326. In some embodiments, the bodies 342 do not contact the substrate 326. More specifically, each isolation unit 336 is positioned at a certain gap height 354 over one of the site-isolated regions 330 on the substrate 326.

Figure 3C:
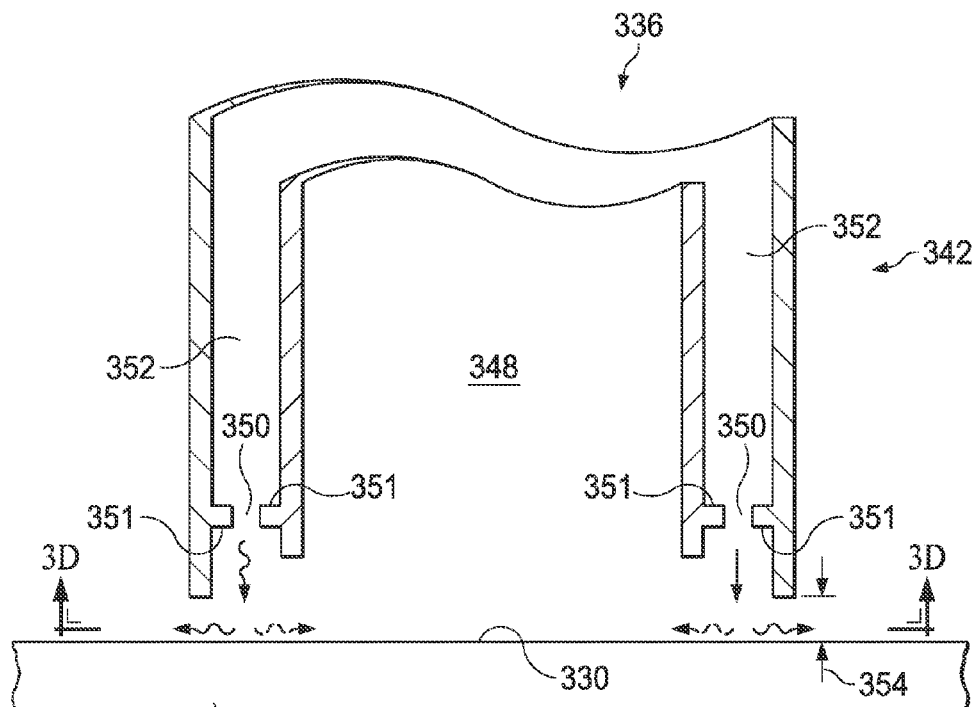
FIG. 3C is a cross-sectional side view of an isolation unit body and a portion of a substrate within the substrate processing tool of FIG. 3A.
Figure 3D:
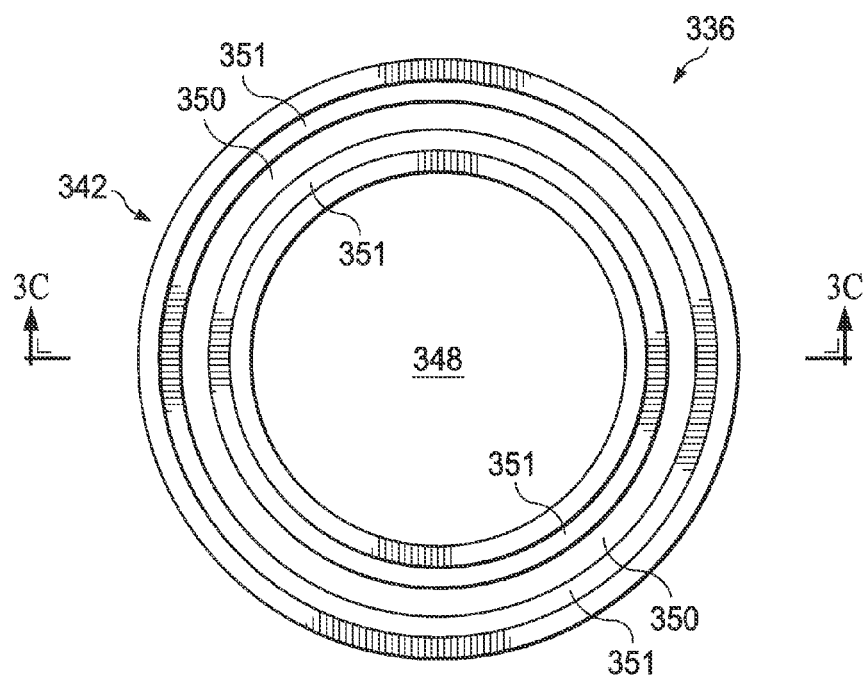
FIG. 3D is a plan view of the isolation unit body along line 3D-3D of FIG. 3C.

FIG. 3C shows the body 342 of one of the isolation units 336, as positioned above a corresponding site-isolated region 330 on the substrate 326. The body 342 is substantially cylindrical in shape and includes a central receptacle 348 and an annular trench outlet 350 extending into a lower surface of the body 342. In some embodiments, the central receptacle 348, like the body 342 itself, is substantially cylindrical in shape and positioned at a central portion of the body 342.

Although not specifically illustrated, the central receptacle 348 is in fluid communication with the processing fluid supply 314, via fluid lines 344 as shown in FIG. 3A. The trench outlet 350 is formed between annular protrusions 351 within the body 342 and symmetrically surrounds the central receptacle 348 and is in fluid communication with an annular plenum 352 which is in fluid communication with the processing fluid supply 314. Of particular interest is that the body 342 of the isolation unit 336 does not contact the upper surface of the substrate 326. In some embodiments, a gap height 354 is defined as a vertical distance between the lowest portion of the body 342 and the substrate 326. In some embodiments, the gap height 354 has a value in the range of 0.02-0.12 mm. In some embodiments, the gap height 354 may be as small as a few micrometers.

The body 342 is formed from a material that possesses proper bulk and surface properties. In some embodiments, the body 342 may be made of a chemically inert material, such as polytetrafluoroethylene (PTFE).

In operation, after the wet processing assembly 324 of FIG. 3A is lowered, a wet process, as is commonly understood, is performed on the site-isolated region(s) 330 on the substrate 326. Examples of wet processes that may be performed on the substrate 326 include wet cleanings, wet etches and/or strips, and electroless depositions.

Referring to FIG. 3C, the operation of the wet processing apparatus 312, illustrated in FIG. 3A, will now be described with respect to one of the isolation units 336. However, it should be understood that all of the isolation units 336 may be similarly operated at the same time.

In order to create a barrier around the site-isolated region 330, a fluid (hereinafter referred to as a "barrier fluid"), such as argon or nitrogen gas, is delivered to the annular plenum 352 in the body 342 of each isolation unit 336 by the processing fluid supply 314. The barrier fluid flows from the annular plenum 352 through the annular trench outlet 350 and onto the substrate 326, where it flows both inwards towards the center of the respective site-isolated region 330 on the upper surface of the substrate 326 and outwards, away from the site-isolated region 330. This gas flow creates an annular fluid barrier around the respective site-isolated region 330 on the substrate that prevents processing fluid (e.g., a liquid) on the substrate 326 from passing between the site-isolated region 330 and the interstitial portion of the substrate 326.

Still referring to FIG. 3C, a processing fluid (e.g., a liquid), such as a cleaning solution, is then delivered to the central receptacle 348 of the body 342 from the processing fluid supply 314 of FIG. 3A. The liquid flows onto the respective site-isolated region 330 on the substrate 326, where it is restricted from flowing onto the interstitial portion of the substrate 326 by the fluid barrier. As such, as the processing liquid continues to flow into the central receptacle 348, a column of liquid is formed within the isolation unit 336 over the respective site-isolated region 330 on the substrate 326.

It should be understood that although the barrier fluid may cover the region 330 on the substrate 326 before the processing fluid is delivered into the central receptacle 348, this portion of the barrier may have a relatively low pressure such that the processing fluid pushes it back, substantially off the site-isolated region 330. In contrast, the portion(s) of the barrier directly under the annular trench outlet 350 may have a relatively high pressure, preventing the processing fluid from passing between the site-isolated region 330 and the interstitial portion of the substrate 326. It should also be understood that in some embodiments, as described below, the flow of the barrier fluid may be reversed, such as for processing the interstitial portion of the substrate 326.

After a predetermined amount of time (i.e., depending on the particular wet process being performed), the liquid may be removed from the central receptacle 348 by the processing fluid supply 314 (i.e., a vacuum supply). As such, the present disclosure allows for wet processes to be performed on only particular portions of the substrate 326, without any of the components of the tool 310 contacting the upper surface of the substrate 326. Thus, the likelihood that any contaminates will be left on the substrate 326 are reduced.

Figure 3E:
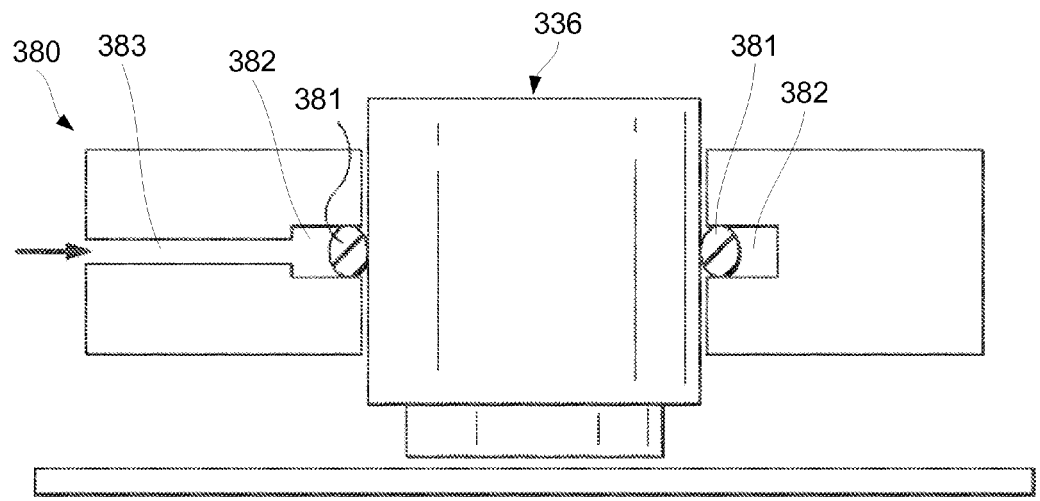
FIGS. 3E and 3F are schematic diagrams of a cell placed and positioned over a site-isolated region on a substrate.
Figure 3F:
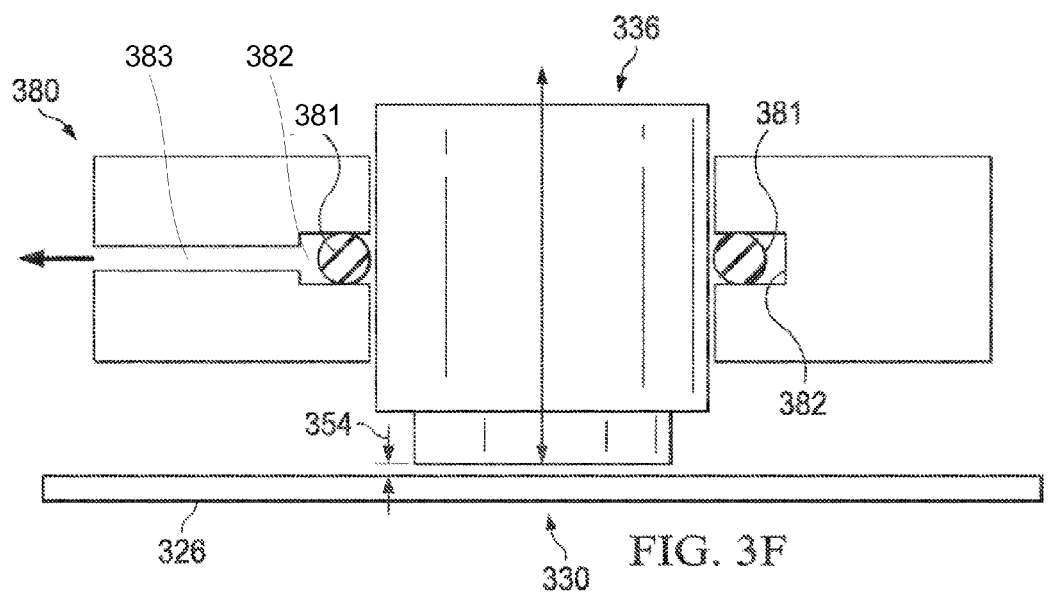
Figure 3G:
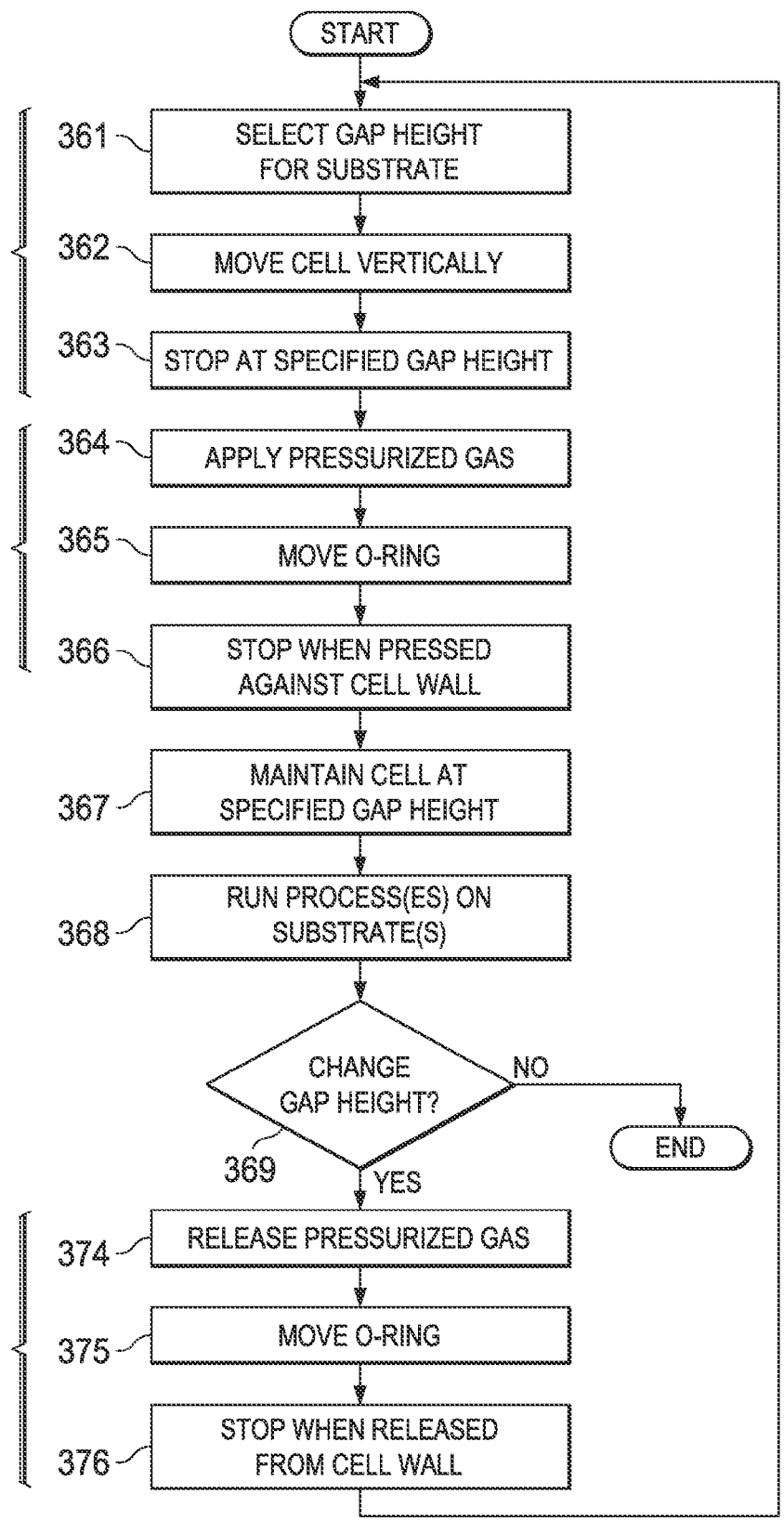
FIG. 3G is a schematic diagram of a method to pneumatically clamp a cell at a specified vertical height.

FIGS. 3E, 3F, and 3G show some embodiments of the method of and the apparatus for pneumatically clamping the cylindrical cell to maintain a specified gap height. First, select a gap height 354 for a cell (or isolation unit) 336 located over a site isolated region 330 on a substrate 326 as indicated in operation 361 of FIG. 3G. Second, move the cell (or isolation unit) 336 vertically as shown in operation 362 of FIG. 3G and stop at the specified gap height 354 as indicated in operation 363 of FIG. 3G.

This may be done by loading a dummy substrate onto a chuck 322 (see FIG. 3A) under a support plate 380. An array of adjustable cells 336 may be mounted in the support plate 380 in a fixed position. The dummy substrate may be moved into a nominal position plus the specified gap height 354. In some embodiments, the array of adjustable cells 336 conforms to a surface contour of the dummy substrate.

Third, apply pressurized gas as indicated in FIG. 3E and operation 364 of FIG. 3G using a traverse channel 383. The increase in pressure will move an O-ring 381 in a gland (or groove) 382 as indicated in FIG. 3E and operation 365 of FIG. 3G. Next, stop applying pressure when the O-ring 381 is pressed against a wall of the cell (or isolation unit) 336 as indicated in FIG. 3E and operation 366 of FIG. 3G. It should be understood by those having ordinary skill in the art that the O-ring 381 pressed against the wall of the cell (or isolation unit) 336 will maintain the cell 336 at the specified gap height 354 as indicated in FIG. 3F and operation 367 of FIG. 3G. The dummy substrate may be lowered away from the array of adjustable cells 336 and removed from the chuck 322. Next a substrate 326 to be processed is loaded onto the chuck 322 and raised into the process position thus resulting in the specified gap height 354.

Fourth, run process(es) as part of combinatorial processing as indicated in operation 368 of FIG. 3G. Fifth, upon completion of the process(es), release the pressurized gas as indicated in operation 374 of FIG. 3G (if it is desired to adjust the gap height 354) again. It should be understood by those having ordinary skill in the art that the decrease in pressure will move the O-ring 381 in the gland (or groove) 382 as indicated in operation 375 of FIG. 3G and is shown in FIG. 3F. Next, stop releasing pressure when the O-ring 381 is released from the wall of the cell (or isolation unit) 336 as shown in operation 376 of FIG. 3G. Finally, move the cell 336 vertically as indicated is operation 362 of FIG. 3G.

In some embodiments, the O-ring 381 may include a torus or doughnut shape and may include a hollow or solid cross-section. In addition, the O-ring 381 may have a circular cross-section or include other types such as, but not limited to, an X-ring, square-ring, and delta-ring. In some embodiments, the O-ring 381 may include lobes.

The O-ring 381 may be formed (e.g. molded) from a polymer, such as an elastomer. In some embodiments, the O-ring 381 is molded from synthetic rubber. In some embodiments, the carbon backbone of the polymer may be saturated or unsaturated (with hydrogen). The carbon backbone may be partially cross-linked. The carbon backbone may include functional groups, some of which include oxygen in accordance with some embodiments of the present disclosure.

In some embodiments, the O-ring 381 may be formed from other materials, such as PTFE (such as Teflon), a thermoplastic, or a metal.

An O-ring assembly may be used to create a seal such that a fluid, such as a gas or a liquid, stops flowing around or past it. In some embodiments, the O-ring seal assembly includes the O-ring 381 and the gland 382 which may include a cavity, such as a groove 382, formed in a plate or housing 380 from metal or other hard material. In some embodiments, the gland 382 contains and supports the O-ring 381. In some embodiments, the O-ring 381 is lightweight and does not occupy much space or volume.

The O-ring assembly may seal over a large range of pressure, temperature, or tolerance. In addition, stability may refer to an ability of the O-ring 381 to resist rolling, twisting, and shifting within the groove.

Furthermore, preferably, the O-ring 381 will not produce any critical torque upon tightening so it will not cause any structural damage to the plate or housing 380 of hard material constraining it.

Other seal structures may be used instead of the O-ring 381 and the seal structure need not have the circular shape or the circular cross-section. In some embodiments, the seal structure should be formed from a soft material (partially or entirely) confined between two mating members: an inner member, such as the cell 336, and an outer member, such as the plate or housing 380, that may both be formed from hard or stiff materials.

Upon application of mechanical pressure, such as by pressurized gas, compressed air (pneumatic), or hydraulic fluid (hydrostatic), the O-ring (or seal structure) 381 is squeezed out-of-round, or otherwise reversibly distorted or deformed, to slow and subsequently prevent passage of the pressurized gas or hydraulic fluid. The fluid may have lubricating properties and may have heat transfer, such as cooling properties.

In some embodiments, upon application of mechanical pressure, the O-ring (or seal structure) 381 is squeezed out-of-round, or otherwise reversibly distorted or deformed, to increase friction at an interface and then to prevent sliding, such as vertical, motion of the cell 336.

Furthermore, breakout friction refers to a force that is necessary to start a motion (such as vertical) of the cell 336 relative to the plate or housing 380. Thus, in some embodiments, O-ring 381 should apply sufficient friction to prevent the relative motion (e.g. vertical) of the cell 336 for a specified duration.

Typically, the cell 336 which is formed from a hard material will reduce friction. Conversely, the O-ring 381 when formed from a hard material will increase friction because for the same squeeze of the O-ring 381, the hard material provides greater compressive force than the soft material.

In some embodiments, when two mating members differ in hardness, it is preferable to place the O-ring 381 in a groove 382 in the member formed from the softer material because the member formed from the harder material may be less damaged thus forming a better sealing surface for the O-ring 381.

The material forming the O-ring 381 should be selected to be resistant to chemicals in the vicinity. Suitable material may include a fluorocarbon (such as Viton) or perfluorocarbon (such as Kalrez) elastomer. Consequently, prolonged exposure to the chemicals should not result in excessive softening, hardening, shrinking or swelling of the O-ring 381. Furthermore, the O-ring 381 should not be permeable to the chemicals, even upon application of mechanical or hydrostatic pressure.

The material forming the O-ring 381 should be selected to withstand a specified range of temperatures and pressures. In general, the coefficient of thermal expansion of the material forming the O-ring 381 should be low.

The seal to close a passage may involve a contact that is non-impact or impact. The O-ring 381 should absorb the force from any impact or shock. In some embodiments, a pressure relief valve may be connected to the enclosed channels within which pressurized gas or hydraulic fluid travels.

The seal formed between the two mating members may be static (without any relative motion) or dynamic (with a relative motion). The static seal may be axial or radial, referring to a primary direction in which the cross-section of the O-ring 381 is to be squeezed. In some embodiments, the dynamic seal is only radial and may accommodate any motion used in the process, such as reciprocating, rotating, or oscillating.

Just as for a gasket seal, pressure may be applied to the static axial seal to both an upper and a lower surface of the O-ring 381. This type of seal is typically used in a face (flange) type of application. When used as a face seal, the O-ring 381 is seated against a low pressure side of the groove 382.

Pressure may be applied to the static radial seal to the surfaces of both an outer and an inner diameter of the O-ring 381. There are two types of radial designs. In some embodiments, a tube (or cap) seal is used with female glands (such as in the housing or plate 382 around the cell 336). In some embodiments, a plug seal is used with male glands such as in the cell 336 within the housing or plate 382.

In some embodiments, when an inner diameter (I.D.) of the O-ring 381 is stretched, the cross-section is reduced. To ensure adequate seal squeeze, the stretch should not exceed 5%.

In some embodiments, to minimize wear and to avoid premature seal failure, the mating members should have a surface finish of less than 32 microinches root mean squared (RMS). However, the surface finish should not be less than 10 microinches RMS.

In some embodiments, extrusion (or nibbling) may occur in response to an excessive pressure which exceeds a deformation limit of the O-ring 381. Extrusion refers to a flowing of the body of the O-ring 381 over the corners of the groove 382 and into a diametrical clearance gap between the cell 336 and the bore in the surrounding housing (or plate) 380. Groove depth includes the machined groove depth and the clearance gap. Extrusion is often a risk for static radial seals and dynamic radial seals. However, extrusion is rarely a risk for static axial seals since they do not have a clearance gap.

In some embodiments, multiple O-rings 381 may be arranged in series. For example, a back-up ring, such as formed from a hard material, may be installed (downstream from the system pressure) to prevent extrusion of the O-ring 381 by closing the clearance gap and providing support to the O-ring 381. Furthermore, in double-acting applications, two back-up rings may be installed, one on each side of the O-ring 381. The back-up ring(s) may have a solid, split (scarf-cut), or spiral design. The back-up ring(s) may also be contoured.

To prevent extrusion, the gland or groove 382 may include a rectangular cross-section with straight sidewalls. To simplify machining of the groove 382, sidewalls with a positive 5-degree slope are also acceptable. In some embodiments, a V-groove may be used instead of a U-groove. An undercut (such as with a negative 66- to 68-degree slope) or dovetail groove may be used if it is necessary to prevent the O-ring 381 from falling out of the groove 382. For example, the dovetail groove may be used with an O-ring 381 having a cross-section larger than 0.139 inch (or 3.53 mm).

Methods and apparatuses for combinatorial processing have been described. It will be understood that the descriptions of some embodiments of the present disclosure do not limit the various alternative, modified and equivalent embodiments which may be included within the spirit and scope of the present disclosure as defined by the appended claims. Furthermore, in the detailed description above, numerous specific details are set forth to provide an understanding of various embodiments of the present disclosure. However, some embodiments of the present disclosure may be practiced without these specific details. In other instances, well known methods, procedures, and components have not been described in detail so as not to unnecessarily obscure aspects of the present embodiments.

What is claimed is:

1. An apparatus for combinatorial wet processing, comprising:
    a chuck operable to hold a substrate thereon;
    a plurality of cells disposed over the chuck; and
    a support plate comprising a plurality of annular glands, a plurality of transverse channels, and a plurality of O-rings,
        wherein the support plate is disposed around each of the plurality of cells for pneumatically clamping each of the plurality of cells and maintaining a vertical position of each of the plurality of cells relative to the chuck,
        wherein each of the plurality of annular glands is arranged in registration with a respective one of the plurality of cells,
        wherein each of the plurality of O-ring is disposed within a respective one of the plurality of annular glands and surrounds a corresponding one of the plurality of cells;
        wherein each of the plurality of transverse channels connects a respective one of the plurality of annular glands to a pressure source for supplying one of a pressurized gas and a hydraulic fluid into the respective one of the plurality of annular glands and changing a pressure differential across a respective one of the plurality of O-rings within the respective one of the plurality of annular glands;
        wherein each of the plurality of O-rings seals a respective one of the plurality of annular glands such that the one of the pressurized gas and the hydraulic fluid cannot flow within the respective one of the plurality of annular glands past the each of the plurality of O-rings;
        wherein each of the plurality of O-rings is deformable and movable between a first position and a second position within a respective one of the plurality of annular glands in response to changing the pressure differential across the each of the plurality of O-rings within the respective one of the plurality of annular gland while sealing the respective one of the plurality of annular gland;

wherein, in the first position, each of the plurality of O-rings is pressed against a respective one of the plurality of cells causing a static friction at an interface between the each of the plurality of O-rings and the respective one of the plurality of cells and maintains the vertical orientation of the respective one of the plurality of cells relative to the support plate; and wherein, in the second position, the each of the plurality of O-rings is spaced apart from a respective one of the plurality of cells and allows the respective one of the plurality of cells to move vertically relative to the support plate.

2. The apparatus of claim 1, wherein each of the plurality of O-rings has a torus shape.

3. The apparatus of claim 1, wherein each of the plurality of O-rings has a hollow cross-section.

4. The apparatus of claim 1, wherein each of the plurality of O-rings comprises polytetrafluoroethylen (PTFE).

5. The apparatus of claim 1, wherein each of the plurality of O-rings comprises a perfluorocarbon elastomer.

6. The apparatus of claim 1, wherein each of the plurality of annular glands has a rectangular cross-section with straight sidewall.

7. The apparatus of claim 1, wherein each of the plurality of annular glands comprises a dovetail grove.

\* \* \* \* \*